US006872082B2

(12) United States Patent
Hsu et al.

(10) Patent No.: US 6,872,082 B2
(45) Date of Patent: Mar. 29, 2005

(54) LAND GRID ARRAY CONNECTOR HAVING WIPING TERMINALS

(75) Inventors: Chien-Yu Hsu, Taoyuan Hsien (TW); Yen-Jang Liao, Taoyuan Hsien (TW); Li-Sen Chen, Taoyuan Hsien (TW)

(73) Assignee: Speed Tech Corp., Taoyuan Hsien (TW)

( * ) Notice: Subject to any disclaimer, the term of this patent is extended or adjusted under 35 U.S.C. 154(b) by 13 days.

(21) Appl. No.: 10/640,253

(22) Filed: Aug. 14, 2003

(65) Prior Publication Data

US 2005/0037635 A1 Feb. 17, 2005

(51) Int. Cl.[7] .......................... H01R 12/00; H05K 1/00

(52) U.S. Cl. ........................... 439/66; 439/91; 439/591

(58) Field of Search ............................ 439/66, 91, 591

(56) References Cited

U.S. PATENT DOCUMENTS 5,984,693 A * 11/1999 McHugh et al. .............. 439/66
6,062,871 A 5/2000 Arai et al. .................... 439/66
6,146,152 A 11/2000 Mchugh et al. ............... 439/66
6,179,624 B1 * 1/2001 McHugh et al. .............. 439/71
6,203,331 B1 * 3/2001 McHugh et al. .............. 439/71
6,227,869 B1 * 5/2001 Lin et al. ...................... 439/66
6,241,531 B1 * 6/2001 Roath et al. .................. 439/66
6,299,458 B1 * 10/2001 Yamagami et al. ........... 439/66

* cited by examiner

*Primary Examiner*—Hae Moon Hyeon
(74) *Attorney, Agent, or Firm*—Rabin & Berdo, P.C.

(57) ABSTRACT

A land grid array includes a flat-plate connector plastic housing having a plurality of terminal grooves, and a plurality of terminals having a pair of contact points and disposed in the various terminal grooves, wherein the contact points serve as connecting structures between a circuit board and another circuit board, or between an integrated circuit and a circuit board. Each terminal is formed by bending an integral metal plate, and has a fixing portion, a flexible portion and a signal transmission portion. The terminal is capable of reducing overall stress, such that the signal transmission portion is easily deformed without leaving permanent deformation. Meanwhile, wiping motions by the contact points are performed between a circuit board and another circuit board, or between an integrated circuit and a circuit board for removing oxidized thin-films on contact surfaces involved.

5 Claims, 6 Drawing Sheets

LAND GRID ARRAY CONNECTOR HAVING WIPING TERMINALS

BACKGROUND OF THE INVENTION (a) Field of the Invention

The invention relates to a land grid array connector, and more particularly, to a land grid array connector having high-density contact points serving as connecting structures between a circuit board and another circuit board, or between an integrated circuit and a circuit board. The land grid array connector is deformed when a signal transmission portion thereof is suppressed without resulting in permanent deformation, however. Wiping movements of the contact points are performed between a circuit board and another circuit board, or between a circuit board and an integrated circuit, so as to remove oxidized thin-films at involved contact surfaces for facilitating signal transmission. Moreover, when terminals of the connector are assembled to corresponding terminal grooves at a connector plastic housing, a gap is reserved between the terminals and rear walls of the terminal grooves, and is for absorbing variation caused from suppression of a signal transmission portion, thereby accomplishing optimal connection effects.

(a) Description of the Prior Art

A common land grid array connector, and especially a high-density connector as disclosed by the U.S. Pat. No. 6,062,871, 6,146,152, and 6,203,331 (FIG. 8 shows the U.S. Pat. No. 6,062,871), comprises an insulative housing 10 having a plurality of slits 11, and a plurality of terminals 20 with a pair of contact points and being inserted in the slits 11. Each terminal 20 is a structure directly formed from a metal plate by stamping, wherein a first contact point 21 thereof is extended upward from a transmission section 23 thereof, and a second contact point 22 is disposed at a bottom end of the transmission section 23. Therefore, the material anti-bending strength (flexibility) between the upper and lower contact points 21 and 22 is a square of a width of cross section multiplied by a height of the upper and lower contact points 21 and 22. The contact points are limited by the transmission section 23 of the terminal 20, and variation thereof is not drastically fluctuated due to limitations of space. Although a cantilever in a middle section receives a portion of stress, stress imposed on the terminal 20 is yet quite large due to the limited variation. In addition, stress is amplified by the plurality of terminals 20 in the entire connector. Consequently, when the connector is applied in a land grid array connection with unsatisfactory planeness between individual contact points, a portion of the terminals may have poor contact. To provide the terminals with better contact, large forces pressing downward are needed. However, deformation of the circuit board then becomes probable and again leads to poor contact, or even damages of components therein.

It is observed that the terminals of the prior land grid array connectors have crucial influences over connection effects, and drawbacks as being likely to damage components and thus increase production costs. Therefore, it is a vital task of the invention as how to advance the prior invention, so as to provide good contact effects, and overcome the above drawbacks namely being likely to damage connected circuit boards or electronic components.

SUMMARY OF THE INVENTION

The primary object of the invention is to provide a land grid array connector, wherein terminals thereof have excellent flexibility, so that when the land grid array connector is practically applied, large forward (up and down) pressure is not required for forcing the terminals in the connector to electrically connect with contact points of a circuit board or an integrated circuit.

The secondary object of the invention is to provide a land grid array connector, wherein relative motions are generated between upper and lower contact points thereof when signal transmission sections of terminals thereof are suppressed, so as to produce friction between the contact points of the terminals and the contact points at a surface of a circuit board for wiping off dirt on involved contact surfaces.

To accomplish the above objects, the land grid array connector in accordance with the invention comprises the characteristics that, each terminal of the connector is formed by bending an integral metal plate, and has a fixing portion, a flexible portion and a signal transmission portion. The fixing portion a vertical plate having an interfering portion projecting toward two sides at an end thereof, respectively. Using the interfering portions, the terminals are fastened in terminal grooves in a plastic housing. The signal transmission portion is a vertical plate, and has arched contact points at upper and lower ends thereof. The flexible portion is joined between the fixing portion and the signal transmission portion, and is for generating relative motions between the upper and lower contact points when the signal transmission portion is suppressed. Each terminal groove at the connector plastic housing is provided with a side channel corresponding to the interfering portions of the terminal. Between the side channel and a rear wall of the terminal groove is a certain distance, and therefore when the terminal is assembled at the terminal groove, a gap is reserved between a rear end of the fixing portion of the terminal and the rear wall of the terminal groove in order to provided variation room for elastic deformation caused by suppression upon the signal transmission portion.

Using the above structure, when the invention is being connecting, each of the terminals is provided with better bending elasticity, and enough room is also reserved for receiving variation of the terminals in the terminal grooves when the terminals are suppressed, thereby reducing counteraction of the terminals and hence accomplishing the aforesaid objects.

DETAILED DESCRIPTION OF THE PREFERRED EMBODIMENTS

Figure 1:
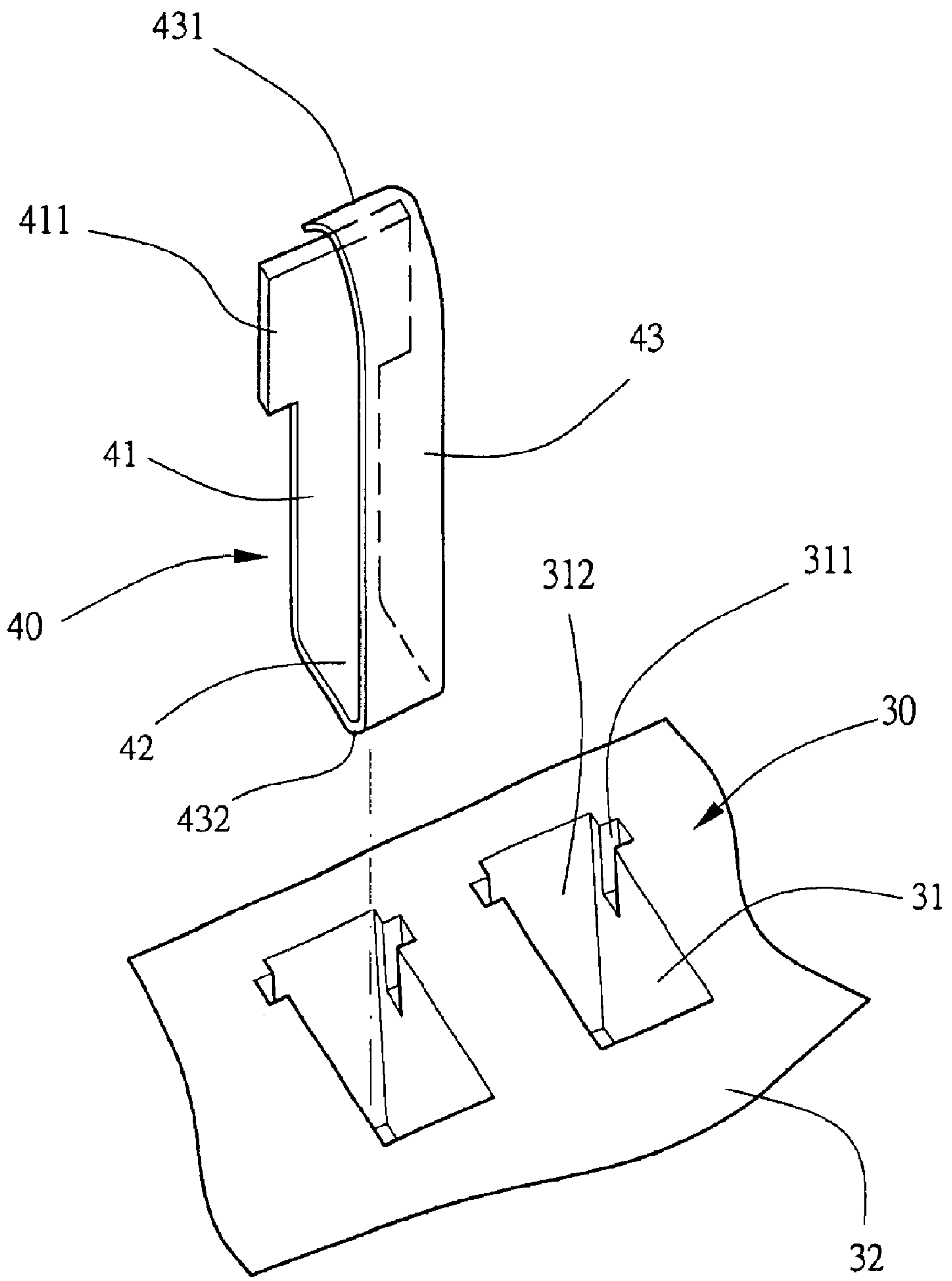
FIG. 1 shows an exploded elevational view of the land grid array connector according to the invention.
Figure 2:
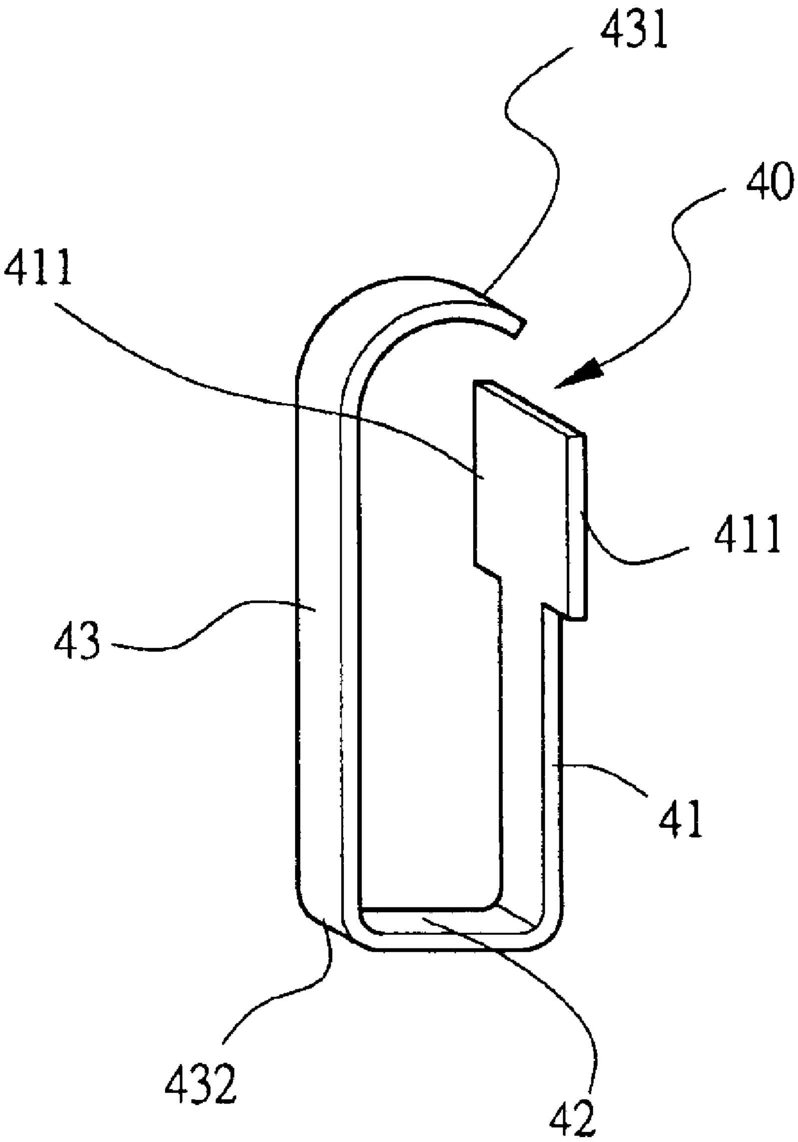
FIG. 2 shows an elevational view of a terminal in an embodiment according to the invention.

Referring to FIGS. 1 and 2, a structure according to the invention comprises a flat-plate connector plastic housing 30 having a plurality of terminal grooves 31, and a plurality of terminals 40 having a pair of contact points and disposed in the various terminal grooves 31. An upper contact point 431 of each terminal 40 is exposed at an upper surface 32 of the plastic housing 30, whereas a lower contact point 432 is exposed at a lower surface 33 of the plastic housing 30 (or hidden in the plastic housing 30). The upper and lower contact points 431 and 432 serve as connecting structures between a circuit board and another circuit board, or between a circuit board and an integrated circuit.

Figure 6:
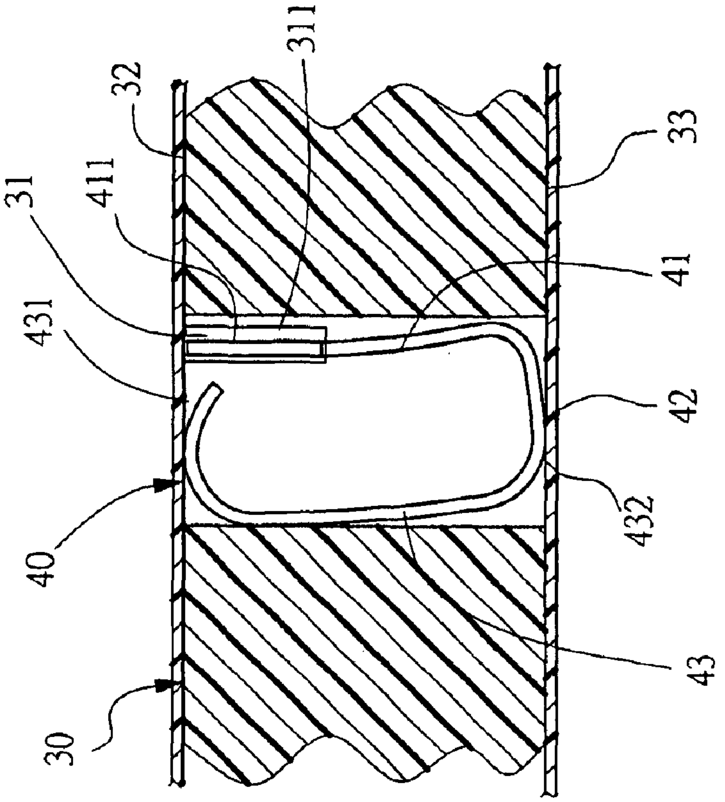
FIG. 6 shows a motional schematic view illustrating the terminal in FIG. 5 being suppressed.

Referring to FIG. 2, each terminal 40 is formed by bending an integral metal plate, and has a fixing portion 41, a flexible portion 42 and a signal transmission portion 43. The fixing portion 41 is a vertical plate having a relatively large thickness, and an interfering portion 411 projecting toward two sides at an end thereof, respectively. Using the interfering portions 411, the terminals 40 are fastened in the terminal grooves 31 in the plastic housing 30. The signal transmission portion 43 is a vertical plate, and has arched contact points 431 and 432 at upper and lower ends thereof. The flexible portion 42 is joined between the fixing portion 41 and the signal transmission portion 43, and is for generating relative motions between the upper and lower contact points 431 and 432 when the signal transmission portion 43 is depressed, so as to produce friction between the contact points 431 and 432 of the terminal 40, and contact points at surfaces of circuit boards for wiping off dirt at contact surfaces involved. The terminal 40 according to the invention is formed by bending an integral metal plate. The terminal 40 is thus provided with good flexibility while stress thereof is apparently smaller than that of the prior art (as shown in FIG. 6). Hence, accumulated stress at individual terminals of the connector is unmatched by the prior art.

Furthermore, each terminal groove 31 at the connector plastic housing 30 is provided with a side channel 311 corresponding to the interfering portions 411 of the terminal 40. The side channel 311 is separated from a rear wall 312 of the terminal groove 31 by a certain distance, and therefore when the terminal 40 is assembled at the terminal groove, a gap is reserved between a rear end of the fixing portion 41 of the terminal and the rear wall 312 of the terminal groove 31. The reserved gap is for absorbing or accommodating material variation caused by depression of upon the upper and lower contact points 431 and 432 at the signal transmission portion 43.

Figure 4:
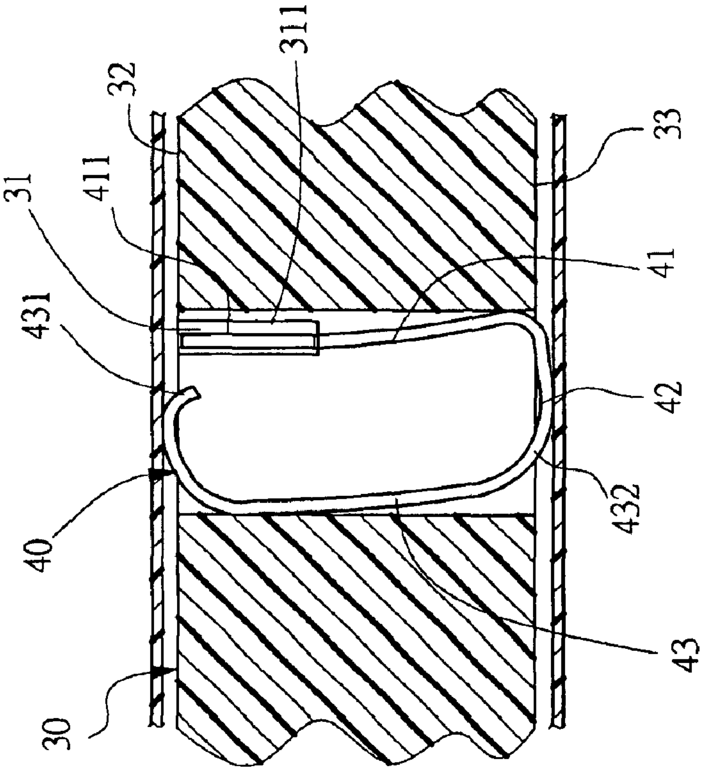
FIG. 4 shows a motional schematic view illustrating the terminal in FIG. 3 being suppressed.
Figure 3:
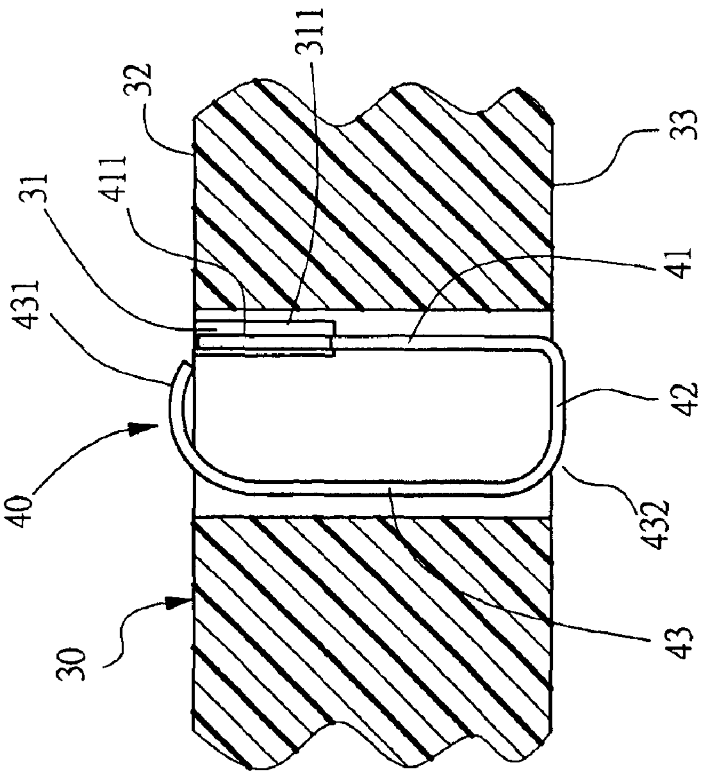
FIG. 3 shows a sectional view illustrating two contact points of the terminal both exposed at surfaces of the plastic housing in an embodiment according to the invention.

Referring to FIGS. 3 and 4, when using the assembled structure as above for connection according to the invention, deformation is incurred for that the upper and lower contact points 431 and 432 at each terminal 40 are simultaneously, depressed, and thus leading to displacement of the fixing portion 41, the flexible portion 42 and the signal transmission portion 43. At this point, oscillation of the flexible portion 42 take place owing to displacement of the two contact points 431 and 432. Wiping motions of the two contact points 431 and 432 of the terminal 40 are then performed at contact surfaces of two circuit boards, or a circuit board and an integrated circuit, so as to scrape off surface dirt or oxidized thin-films for accomplishing excellent contact effects. In addition, in the terminal 40, vertical heights of cross sections at various bent portions are relatively smaller; that is, the metal plate has a larger thickness. As a result, mechanical strength (stiffness) of the terminal 40 is smaller and bending flexibility is better. When the deformation occurs at the terminals 40 being simultaneously suppressed at top and bottom portions thereof, the terminal grooves 31 have enough room for receiving or accommodating variations of the terminals 40 for reducing resistance, thereby decreasing counteractions of the terminals 40 and preventing deformation and damages of circuit boards or electronic components.

According to the connector disclosed by the invention, each terminal 40 has at least one contact point 431 or 432 protruding out of the plastic housing, and thus when the protruding contact point 431 or 432 (431 in this particular diagram) generates downward motions when being depressed, elastic oscillation are caused at the flexible portion 42. Meanwhile, the other contact point 432 is resultantly protruded out of another surface of the plastic housing 30, when the contact portion 432 is depressed, so that the signal transmission portion 43 is bent with elastic deformation. The flexible portion 42 for producing elastic oscillation, and reaction of generated by the elastically deformed signal transmission portion 43, are then capable of forcing the two contacts 431 and 432 to provide forward forces for maintaining electric connection with contacts points at circuit boards.

Figure 5:
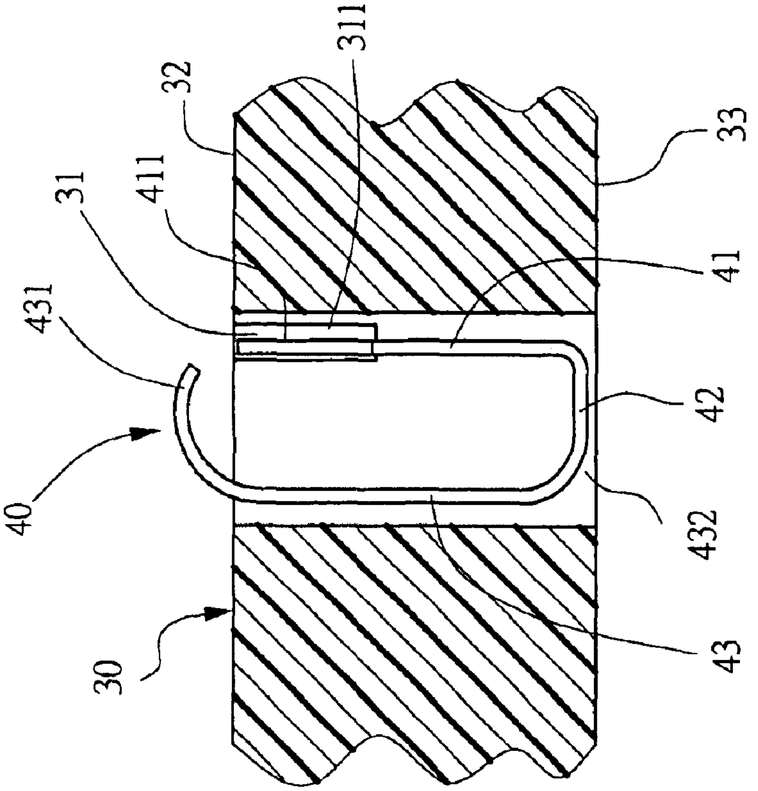
FIG. 5 shows a view illustrating one of the contact points of the terminal exposed at a surface of the plastic housing in an embodiment according to the invention.

Referring to FIGS. 5 and 6, when the terminal 40 is fastened and assembled at the terminal groove 31 of the plastic housing 30, one of the two contact points 431 and 432 is hidden within the plastic housing 30. When the structure is being connected, each terminal 40 is deformed because the contact point 431 protruding out the upper surface 32 of the plastic housing 30 is depressed, such that the other contact point 432 is displaced downward to electronically connect with a contact point of a corresponding circuit board. Similarly, this embodiment also achieves effects namely wiping off surface dirt or oxidized thin-films for accomplishing excellent connection, and preventing deformation and damages of circuit boards and electronic components.

Referring to FIG. 2, the flexible portion 42 of the terminal 40 is horizontal, and is joined at lower ends of the fixing portion 41 and the signal transmission portion 43, and thus giving the terminal 40 a U-shape appearance. Referring to FIGS. 7A and 7B, as described above, at the signal transmission portion 43 of the U-shaped terminal 40, the lower contact point 432 of the terminal 40 is extended from one side or two sides of the signal transmission portion 43 downward by means of stamping.

Figure 7:
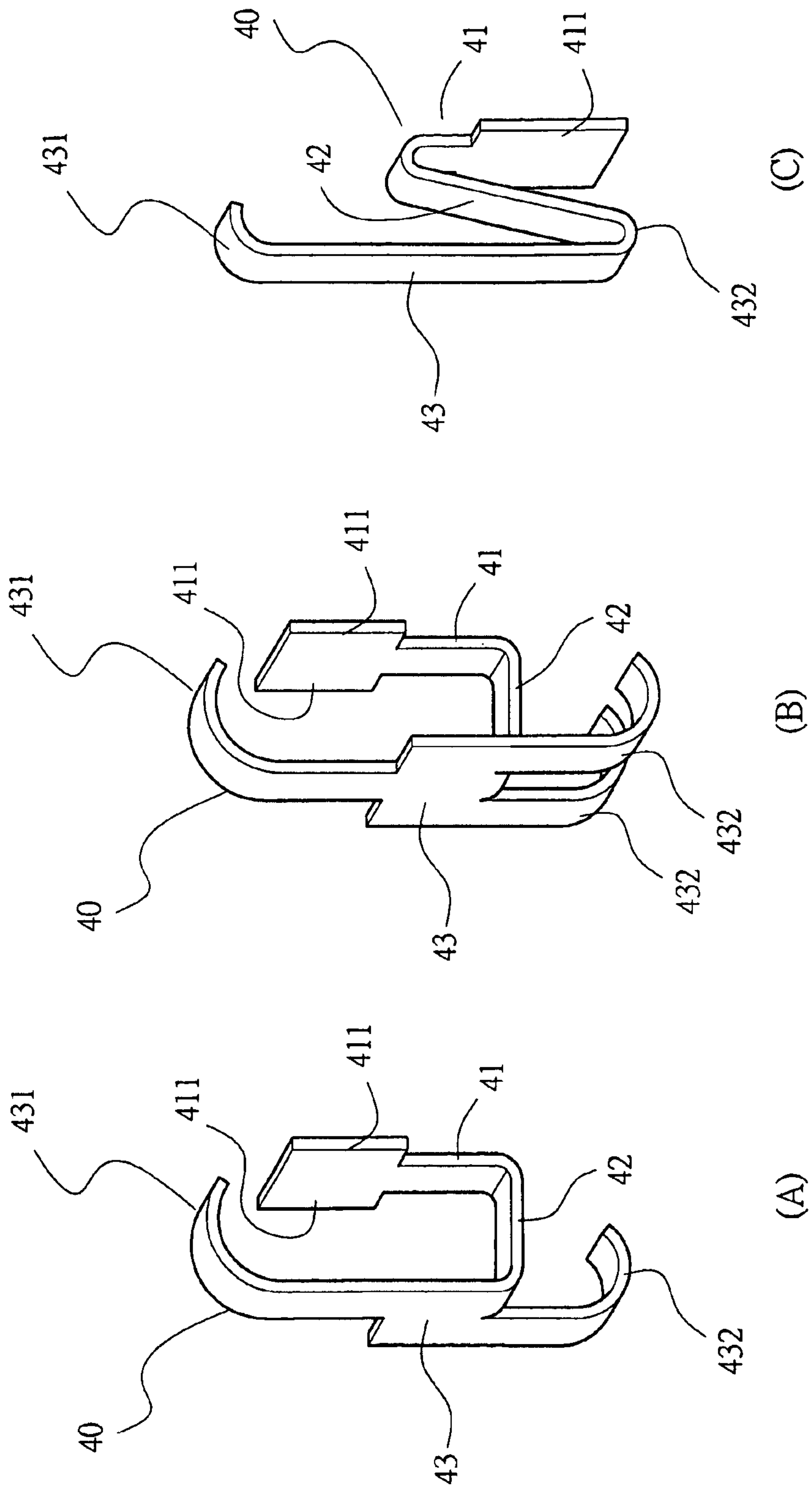
FIGS. 7A to 7C show schematic views of three different embodiments of the terminals according to the invention.
Figure 8:
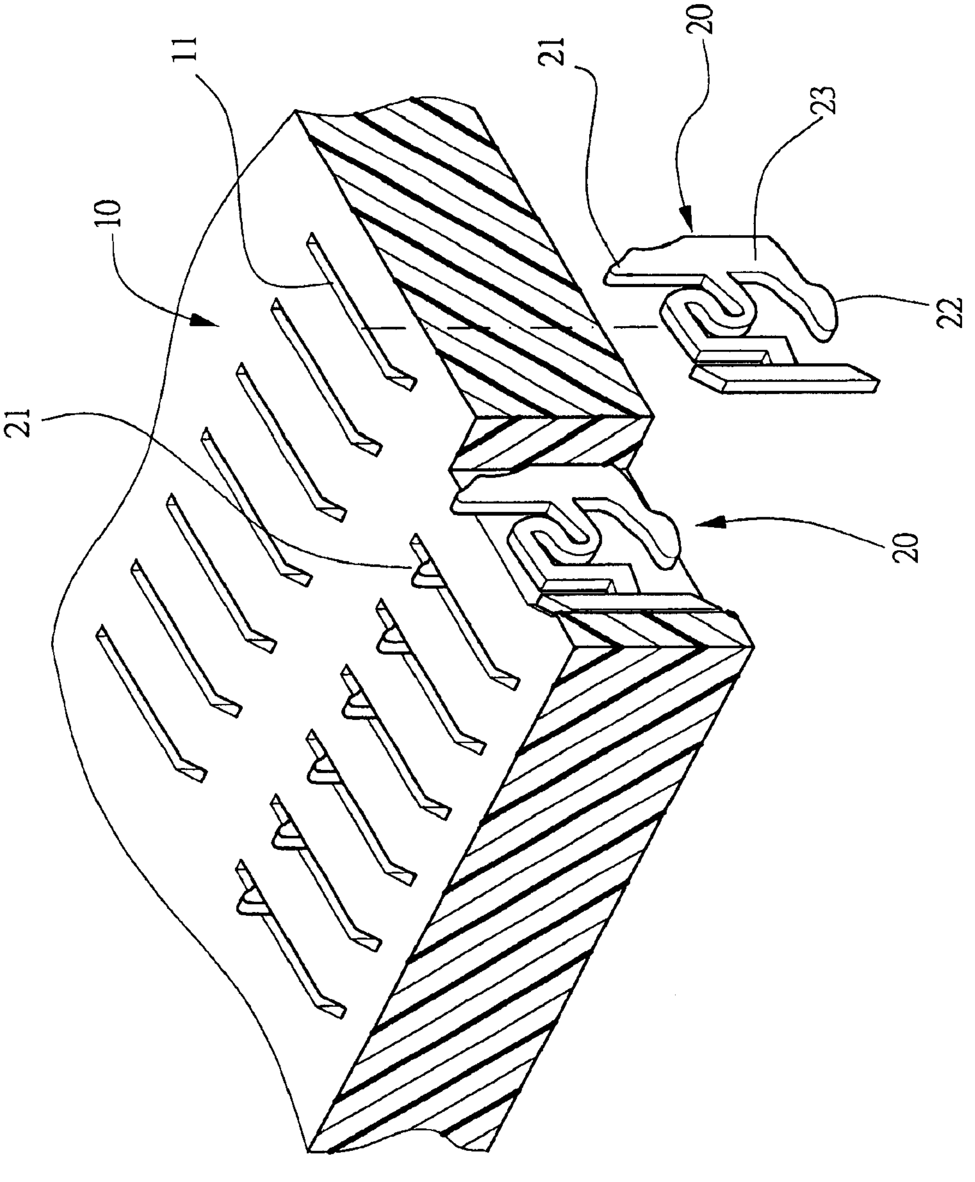
FIG. 8 shows a conventional exploded elevational view of a prior structure.

Referring to FIG. 7, when implementing the terminal 40 according to the invention, the flexible portion 42 is tilted and forms an N-shape with an upper end of the fixing portion 41 and a lower end of the transmission portion 43.

Conclusive from the above, the land grid array connector in accordance with the invention is capable of bearing larger deformation. At the same time, wiping motions by the contact points are performed between a circuit board and another circuit board, or an integrated circuit and a circuit board, thereby removing oxidized thin-films on contact surfaces and providing excellent connection effects between various contact points.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A land grid array connector, comprising:

a flat-plate connector plastic housing having a plurality of terminal grooves, each terminal groove having opposing side channels, the side channels being disposed in front of, and separated from a rear wall of the terminal groove by a distance; and a plurality of terminals, each terminal being disposed in a respective terminal groove, and each being formed from an integral metal plate, each said terminal further having a fixing portion, each said fixing portion having a plate portion, and an interfering portion at an end of said plate portion, the interfering portion being receivable within the opposing side channels to fix the terminal to the respective terminal groove, a rear face of said plate portion being separated from the rear wall of the terminal groove by a gap, each said terminal further having a signal transmission portion having an upper contact point at an upper end thereof and a lower contact point at a lower end thereof, and a flexible portion joined between the fixing portion and the signal transmission portion, said flexible portion being relatively movable when the upper and lower contact points of the signal transmission portion are depressed to thereby cause the upper and lower contact points to generate a wiping motion to ensure electrical engagement between associated contact surfaces and the upper and lower contact points, the gap accommodating variations in a position of said fixing portion when said flexible portion is moved.

2. The land grid array connector in accordance with claim 1, wherein the flexible portion of the terminal is horizontal, and is joined at lower ends of the fixing portion and the signal transmission portion to form a U-shape.

3. The land grid array connector in accordance with claim 2, wherein the lower contact point of the signal transmission portion is extended downward from a side thereof.

4. The land grid array connector in accordance with claim 2, wherein the signal transmission portion has a plurality of lower contact points that extend downward from two sides thereof.

5. The land grid array connector in accordance with claim 1, wherein the flexible portion of the terminal is tilted, and forms an N-shape with an upper end of the fixing portion and a lower end of the signal transmission portion.

* * * * *